United States Patent [19]

Meguire et al.

[11] Patent Number: 4,680,572
[45] Date of Patent: Jul. 14, 1987

[54] CHORD ENTRY KEYING OF DATA FIELDS

[75] Inventors: Patrick G. Meguire, Ithaca; Thomas J. Pitoniak, Trumansburg, both of N.Y.

[73] Assignee: NCR Corporation, Dayton, Ohio

[21] Appl. No.: 330,639

[22] Filed: Dec. 14, 1981

[51] Int. Cl.⁴ .................... H04Q 4/00; G06F 3/02
[52] U.S. Cl. .................... 340/365 R; 340/365 E; 340/365 S; 400/479.1; 400/485
[58] Field of Search ........... 340/365 R, 365 E, 365 S; 364/710; 179/90 K; 178/17 C; 400/479.1, 477, 479.2, 485, 486; 235/12, 14, 145 R

[56] References Cited

U.S. PATENT DOCUMENTS 3,683,370 8/1972 Nagono et al. ............... 340/365 E
3,761,918 9/1973 Hatano et al. ............... 340/365 E

FOREIGN PATENT DOCUMENTS 0043689 3/1980 Japan ............... 340/365 E
0047739 4/1980 Japan ............... 340/365 E Primary Examiner—Donnie L. Crosland
Attorney, Agent, or Firm—J. T. Cavender; Wilbert Hawk, Jr.; George J. Muckenthaler

[57] ABSTRACT

A keyboard system for chord entry keying of alphanumeric data fields includes decoding logic permitting substantially or near-simultaneous depression of numeric or alpha data keys and entry or function keys. The logic provides a decoding algorithm for resolving simultaneous entries by utilizing one or another rule of time of key depression. Depression of a numeric or alpha key within 60 milliseconds of an entry key is permitted for decoding of the data as the last key of the current data field. In a time frame between 60 and 100 milliseconds, a warning tone is received for purposes of verifying the last data field entry and to allow the operator to monitor timing performance.

12 Claims, 19 Drawing Figures

CHORD ENTRY KEYING OF DATA FIELDS

BACKGROUND OF THE INVENTION

In the field of data processing, there are always requirements for and efforts made to increase the speed of operation in order to provide a larger thruput of data. It is, of course, well-known that the standard typewriter keyboard or the QWERTY arrangement, so named for the first six letters of the upper alphabetic key row, has been in use for over 100 years. A new keyboard arrangement is the MALTRON arrangement which makes keys easier to operate by tilting the keyboard toward normal hand and body positions. The MALTRON arrangement also saves time and motion by dividing keys into more efficient groups in that ninety percent of the most often used letters are on the home row, where the operator's fingertips are normally placed in touch typing, as contrasted with fifty percent of the most often used letters on the home row in the QWERTY arrangement.

Another type keyboard uses the conventional ten key arrangement wherein data entry consists of serially depressing one or more numeric data keys followed by a non-numeric data entry key. The numeric keys are constituents of a numeric data field and the field is entered via a subsequent entry key depression. It is seen that because the entry key always follows the last numeric key of the numeric data field, its serial location or the location of the entry key in the keying sequence provides inherently redundant information to the keyboard processor. If the last numeric key and the entry key were depressed simultaneously rather than serially, the same information would be provided. In addition, considerable keying time would be saved since the serial time required to enter the last numeric keystroke of the numeric data field would be eliminated. It is also known that an analysis of current data entry keyboard decoding logic indicated that redundant information is present when an entry key is depressed serially after entry of every numeric data field.

In the area of dual keypad arrangements wherein the right hand makes the numeric entry and the left hand makes the function entry, there are indications of problems with current keyboard operations. In one aspect of the dual keypad arrangement, the keyboard logic rejects successive key entries occurring within 30 milliseconds of each other and provides a warning to the operator of this condition. This logic prevents many potential operator errors and appears to work successfully with successive numeric or right hand entries. However, when the left hand depresses the enter key immediately after the numeric entry, it frequently occurs within the 30 millisecond error window when no operator error has actually occurred. In other words, successive key strokes from different hands appear to occur faster than successive key strokes from the same hand. Of course, it is a known fact that operators have no problem consistently depressing the last digit of an amount and the entry key simultaneously. If this condition were allowed by the keyboard logic in dealing with an average bank document containing approximately 4.5 digits, it would reduce the entry time of each amount by an average of about 150 milliseconds or the time required for a single serial key stroke.

Representative documentation in chord entry keyboards and chord entry keying of data includes IBM Technical Disclosure Bulletin Vol. 21, No. 7, December, 1978, entitled "Chord Keyboard With Case Lock and Chord Definition Features" by R. J. Bamford et al., wherein dimples in the finger keys and troughs in the thumb keys enhance the usability of the keyboard.

IBM Technical Disclosure Bulletin Vol. 21, No. 9, February 1979, entitled "Keyboard Device for Upper and Lower Case Keying Without Shifting" by D. Bantz et al., discloses a pressure-sensitive method and a time-delay method of detection of key strokes as a more convenient way of keying upper case characters.

IBM Technical Disclosure Bulletin Vol. 22, No. 12, May 1980, entitled "Typamatic Feature for Chord Keyboard" by F. C. Bequaert, discloses a feature which permits a user to produce a given character (or sequence of characters) repetitively without having to strike a key (or keys) repeatedly.

U.S. Pat. No. 3,270,853, issued to H. Gerjets et al. on Sept. 6, 1966, shows keyboard apparatus having means to control actuation of circuit impulses for preventing simultaneous actuation of two or more keys.

U.S. Pat. No. 3,675,239, issued to H. T. Ackerman et al. on July 4, 1972, shows an unlimited roll keyboard circuit indicating that a certain key within the keyboard was depressed both during the first strobe pulse and also during the second strobe pulse.

U.S. Pat. No. 3,717,871, issued to I. Hatano et al. on Feb. 20, 1973, discloses a keyboard input device wherein means is provided for obtaining an inhibit signal to prevent the entry of unnecessary input signals resulting from keys operated in such a way that during depression of one key another key is singly or repeatedly operated.

U.S. Pat. No. 3,750,160, issued to J. M. Elzinga on July 31, 1973, discloses a keyboard with a rollover feature wherein two or more keys may be jointly depressed.

U.S. Pat. No. 4,042,777, issued to F. C. Bequaert et al. on Aug. 16, 1977, discloses a one-handed chord keyboard having a finger section and a thumb section for typing of chords formed by simultaneous pressing of one or more keys on the keyboard and control means including switch combinations for each chord on the row of keys.

And, U.S. Pat. No. 4,121,048, issued to R. N. Dev Choudhury on Oct. 17, 1978, discloses a multiple shift electronic keyboard with a shift key utilized to indicate the start of a shift operation and the end of the operation.

SUMMARY OF THE INVENTION

The present invention relates to keyboards and more particularly, to chord entry keying of data fields to increase keying efficiency. More specifically, the invention is directed to chord entry keying involving the substantially or near simultaneous depression of the last data key of a data field and the field entry key wherein the time required to enter the last data keystroke of the field is effectively eliminated from the field entry time.

An analysis and study of standard ten key numeric keypad operation has revealed that operators waste from ten to fifteen percent of their keying time when serially depressing redundant last digit and amount (numeric data field) entry keys, that is, if the last digit key and the amount entry key are depressed simultaneously, the same information is transmitted and entered. Based on the results of the study, an optimum chord entry decoding algorithm was developed which resolves ambiguous or mis-timed simultaneous entries.

It is also noted here that the design requirements for an amount entry keyboard include flexibility for one hand and two hand operation, chord entry decoding logic, error detection and correction logic, displayed field scrolling triggered by an amount entry key, separate warning tones for current data field and last data field (chord entry) errors, N-key rollover and appropriate key switch activation characteristics, keyboard output buffer permitting ten key strokes per second average keying speed and thirty key strokes per second burst keying speed, and capability for generating illegal key sequence warning tones on command from an external keyboard controller.

In the above-mentioned analysis and study, keyboard layouts included one-handed keying with optimized function key layout, two-handed keying with segregated function and numeric keys, two-handed keying with segregated function and numeric keys and chord entry, and two-handed keying with distributed function and numeric keys. It is seen that in the third just-mentioned keyboard layout the chord entry capability allows an operator to simultaneously depress the amount entry key with the thumb of the left hand and the last digit key of an amount with a finger of the right hand. Although it is common to state that two keys may be depressed simultaneously, it is considered impossible to depress both keys at exactly the same instant or moment, by reason of the extremely fast action of the operation, and the amount entry key must necessarily be depressed either slightly before or slightly after the last digit key. The keyboard logic must then decide the exact intent of the operator and thus the last key stroke of an amount may either be an entry key or a digit key, depending upon the operator's timing accuracy.

It was concluded that two special rules could be applied in the system or arrangement for chord entry keying of data fields to take care of the substantially or near simultaneous key depression timing errors through appropriate decoding logic means. First, that whenever a numeric key stroke occurs within 60 milliseconds following an amount entry key stroke the numeric key is decoded as the last numeric of the current amount or data field. Secondly, that whenever a numeric key stroke occurs within 60-100 milliseconds following an amount entry key stroke, a warning tone is sounded. The warning tone indicates that the operator should verify the last data field entry or the tone provides feedback to allow the operator to continually monitor timing performance.

In view of the above discussion, the principal object of the present invention is to provide a keyboard arrangement for increasing operator keying efficiency.

Another object of the present invention is to provide a keyboard arrangement permitting chord entry operation with very little retraining of operators.

An additional object of the present invention is to provide implementation of chord entry operation by means of keyboard decoding logic changes to existing keyboards.

A further object of the present invention is to provide a keyboard arrangement for chord entry operation wherein flexibility of both one-handed and two-handed operation are feasible.

Additional advantages and features of the present invention will become apparent and fully understood from a reading of the following description taken together with the annexed drawing.

BRIEF DESCRIPTION OF THE DRAWING

FIG. 12, is a diagram showing time components for a typical entry item;

DESCRIPTION OF THE PREFERRED EMBODIMENT

Figure 1:
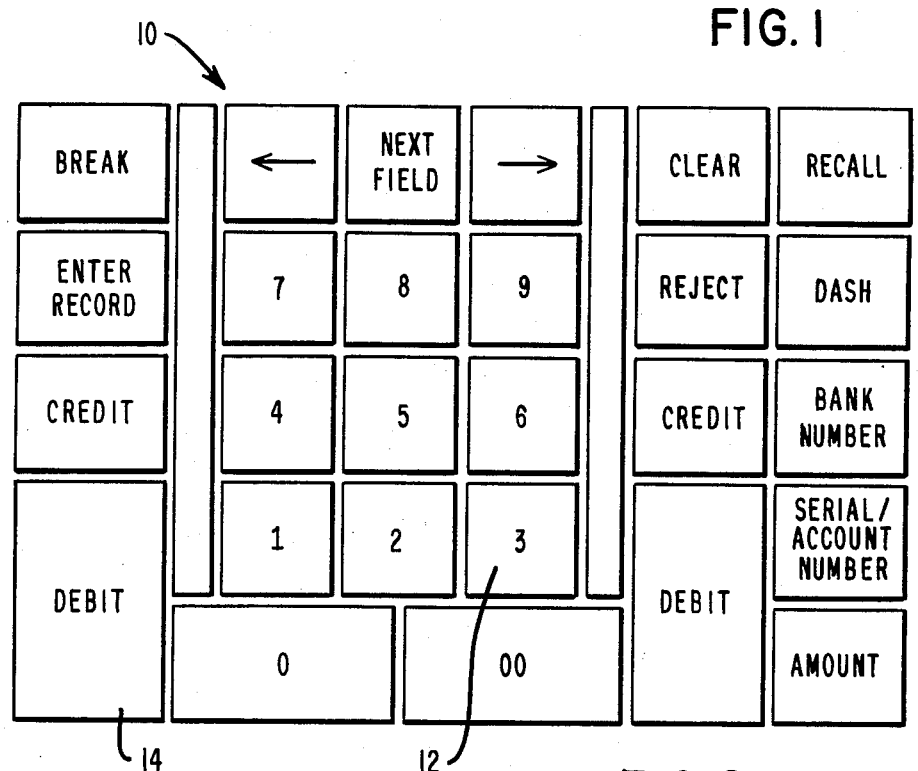
FIG. 1 is a keyboard arrangement with chord entry capability utilizing the concept of the present invention.

Prior to describing the various drawing figures, it should be noted that an area of application of the present invention is in digital image processing technology of bank proofing systems. In previous studies, it has been shown that keying from imaged bank documents can be faster and more accurate than keying from paper or like media bank documents. This improved efficiency was shown to result from elimination of the manual paper handling aspects of the task and improved keyboard logic capable of detecting certain operator keying errors. In this regard, a potential advantage of image-based bank proofing is the freeing of the operator's left hand which has been conventionally used for repetitive paper handling tasks rather than to assist the right hand in basic keying functions.

The results of the above-mentioned studies support the chord entry concept for the amount entry in the item processing system. In regard to document thruput rates, the studies showed that display format played very little role, that alternate keyboards played a significant role, that the two-handed distributed numeric keyboard resulted in the lowest thruput rate, and that the two-handed segregated numeric chord entry keyboard resulted in the highest thruput rate. It was also discovered that the vast majority of chord entry errors resulted from early entry key depressions preceding the first digit of the next amount by a time of 60-100 milliseconds. Based on this finding, it is seen that two decoding logic rules are required for optimum chord entry decoding.

The first rule covers chord entry error suppression in that whenever a numeric keystroke occurs within 60 milliseconds following an amount entry keystroke, the numeric key is decoded as the last data of the current amount field. In other words, the sequential order of the entry key code and numeric key code is reversed by the keyboard processor logic prior to transmission to the host computer. In all other cases, the sequential order of the entry and numeric key codes is left unaltered. Rule 1 provides the optimum keyboard logic for selecting the true last digit of the current amount field. Since this rule does not preclude the use of normal one-handed serial entry operation of the code entry keyboard, an operator can use the more familiar serial entry technique rather than the chord entry technique.

The second rule covers chord entry error feedback in that whenever a numeric keystroke occurs in the time frame of 60-100 milliseconds following an amount entry keystroke, a warning tone is sounded. The order of transmission of these key codes is left unaltered. Rule 2 provides the operator with a warning that a chord entry error may have occurred and consequently, the last amount entry should be verified by use of the RECALL function. Also, the warning tone provides learning feedback by continuously monitoring the operator's chord entry timing performance. In effect, the warning tone provides a plus or minus 20 millisecond margin of safety for chord entries falling in the ambiguous chord entry interpretation zone.

It is also seen that the keying workload of the right hand is significantly reduced as a result of shifting the amount entry responsibility to the left hand and that the chord keyboard layout permits both one-handed and two-handed keying. The primary amount entry keys should be operable in both serial entry and chord entry modes. These operationally distinct modes need not be switch selectable because keyboard logic can treat the chord entry mode as a subset of the serial entry mode. In order to accomplish this operational concept, the keyboard processor logic must apply the two special rules, as mentioned above, to all keyboard inputs. It is considered sufficiently important to repeat that whenever the numeric keystroke occurs within 60 milliseconds following the amount entry keystroke, the numeric key is decoded as the last data of the current amount field, and that whenever the numeric keystroke occurs within the time frame of 60-100 milliseconds following the amount entry keystroke, the warning tone is sounded. The order of transmission of these key codes is left unaltered.

Referring now to the drawings, FIG. 1 shows an arrangement of a keyboard 10 having chord entry capability and which includes numeric keys 12 and function keys 14. The conventional ten key keyboard is surrounded by function keys and the ten keys may be operated with the right hand whereas certain function keys may be operated with the left hand.

Figure 2:
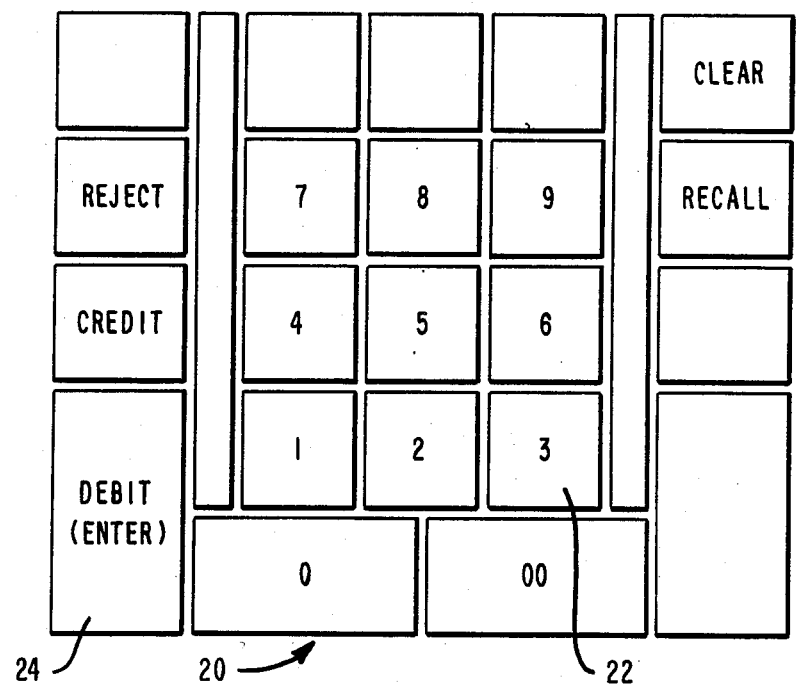
FIG. 2 is another keyboard arrangement with chord entry capability utilizing the concept of the present invention.

FIG. 2 shows a keyboard 20 having chord entry capability and includes numeric keys 22 along with function keys 24. The operational posture required to operate these keyboards may be a choice of one-handed keying with both numeric and function keys operated by the right hand, two-handed keying with numeric and function keys operated by both hands, or one or two-handed keying with numeric keys operated by one hand and function keys operated by either hand in a manner which is at the discretion of the operator. The keyboard layout permits both left-handed chord entry operation of all primary amount keys and conventional one-handed operation as a slightly modified standard numeric keypad. In view of the similarity to the standard ten key keyboard layout, manufacturing costs are minimized, operator re-training is minimized and conventional one-hand numeric keying skills are applicable for operators unable to master the chord entry technique.

Figure 3:
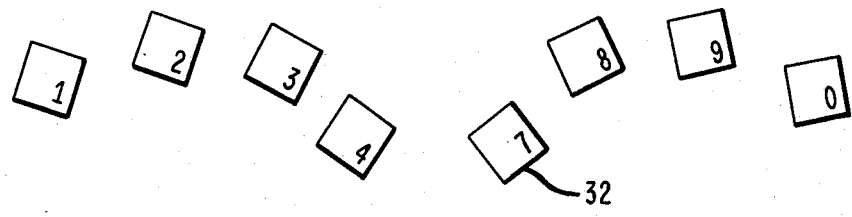
FIG. 3 is a keyboard arrangement wherein every key except the enter key is in a home position.
Figure 3:
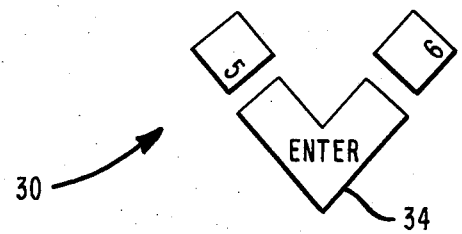

FIG. 3 illustrates a two-handed ten key numeric keyboard arrangement 30 wherein every numeric key 32 is in a home position except for the enter key 34. It is seen that operators are not required to learn complex key-to-key finger movements and the selection of numeric values for each key is drawn from the operator's previous experience. The keys are located in a pattern that matches natural finger positions in a relaxed state with forearms converging to bring the hands close together and all keys operate with a conventional downward motion.

Figure 4:
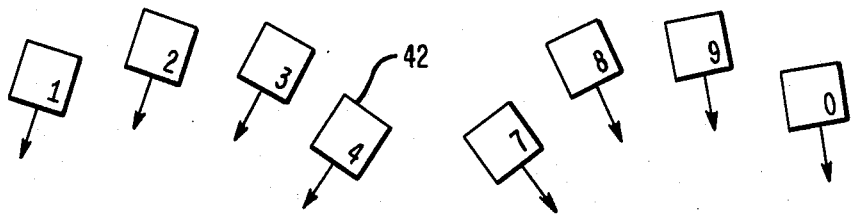
FIG. 4 is a keyboard arrangement wherein key movement corresponds to a natural finger movement.
Figure 4:
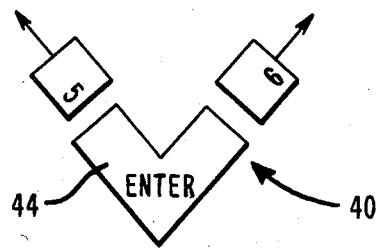

FIG. 4 represents a variation or modification of a keyboard 40 having numeric keys 42 arranged in a manner wherein key movement corresponds to a more natural finger movement in the direction of the arrows. The enter key 44 operates with the conventional vertical motion and all other keys 42 operate in the arrow direction approximately twenty degrees (20°) below horizontal. An advantage is that finger motions allowed in this embodiment should further reduce operator fatigue.

Figure 5:
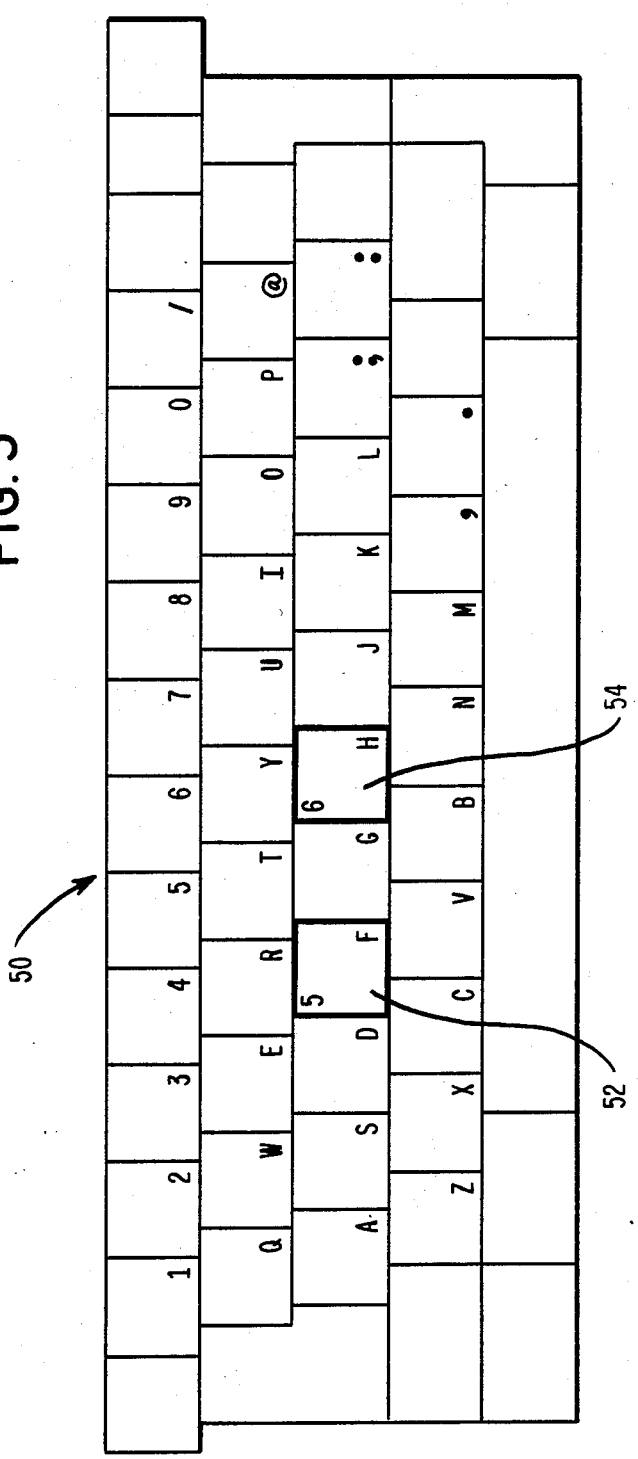
FIG. 5 is a numeric keyboard embedded in an alpha keyboard.

FIG. 5 shows a keyboard 50 having a two-handed arrangement of numeric keys 52 embedded into and among standard alpha keys 54. This arrangement preserves the essential advantages of two-handed numeric keying while eliminating the space requirements and cost of a separate ten key numeric keypad. Additionally, the arrangement avoids many key-to-key finger movements, avoids multiple key depressions either serial or simultaneous per character, and avoids special coding schemes. Stated in a positive manner, all key locations should be home key positions, each key should have only one meaning, and operators should not have to learn special coding schemes. The arrangement also provides a major reduction in the visual clutter found in conventional embedded numeric keyboards.

FIGS. 6A and 6B, 7A and 7B, 8, 9, 10 and 11 illustrate flowcharts of keyboard logic utilized in the present invention. The charts include all chord entry, error detection and error suppression logic. Since, as mentioned above, the primary amount keys should be operable in both serial entry and chord entry modes, the keyboard logic treats the chord mode as a subset of the serial entry mode and the two special rules covering 0-60 milliseconds and 60-100 milliseconds accomplish this purpose.

The error detection logic of the flowchart provides that keying errors detected by an operator before amount entry should be correctable via the CLEAR function. Keying errors detected by an operator immediately following amount entry should be correctable via the RECALL function.

In the error detection and suppression area, it is seen that four distinct types of potential keying errors are detectable by keyboard processor logic, which types are bounce, dual depression, chord entry and dwell. Bounce and dual depression errors result from two or more unintentional, identical (bounce) or nonidentical (dual), numeric key-switch inputs occurring within plus or minus 30 milliseconds. Chord-entry errors result from unintentional, chord entry key depressions preceding the last digit key depression of an amount by 60-100 milliseconds. Dwell errors result from intentional keyswitch inputs lasting less than two keyboard scans (20 milliseconds) on a conventional double validation keyboard.

The keyboard processor should take the following actions for the four error types. In the case of bounce errors, the processor should transmit only one of the redundant numeric inputs. In the case of dual depression errors, the processor should sound a warning tone requesting the operator to clear and re-key the current amount field. In the case of chord entry errors, the processor should sound a warning tone requesting the operator to recall and possibly re-key the previous amount field. In the case of dwell errors, the processor should modify the conventional double validation noise suppression technique via an immediate, rather than delayed, re-scan of keyswitch inputs.

It is also seen from the flowchart that two audibly distinguishable warning tones are required to alert the operator to either clear and re-key the current amount field following a dual depression or illegal sequence keying error, or to recall and possibly re-key the last amount field following a chord entry keying error.

Figure 6A:
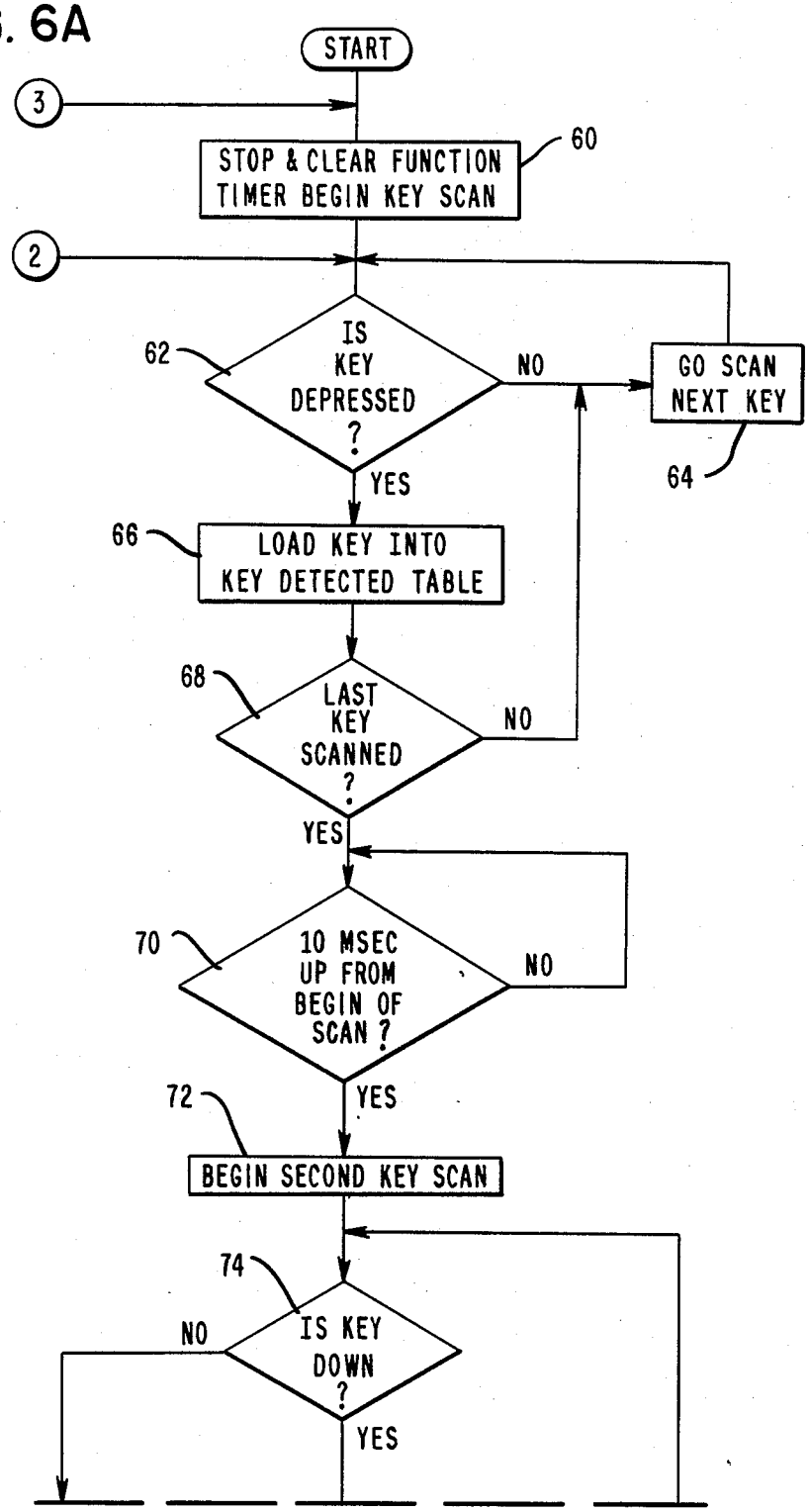
FIGS. 6A and 6B, 7A and 7B, 8, 9, 10 and 11 illustrate flowcharts of keyboard logic utilized in the present invention.
Figure 6B:
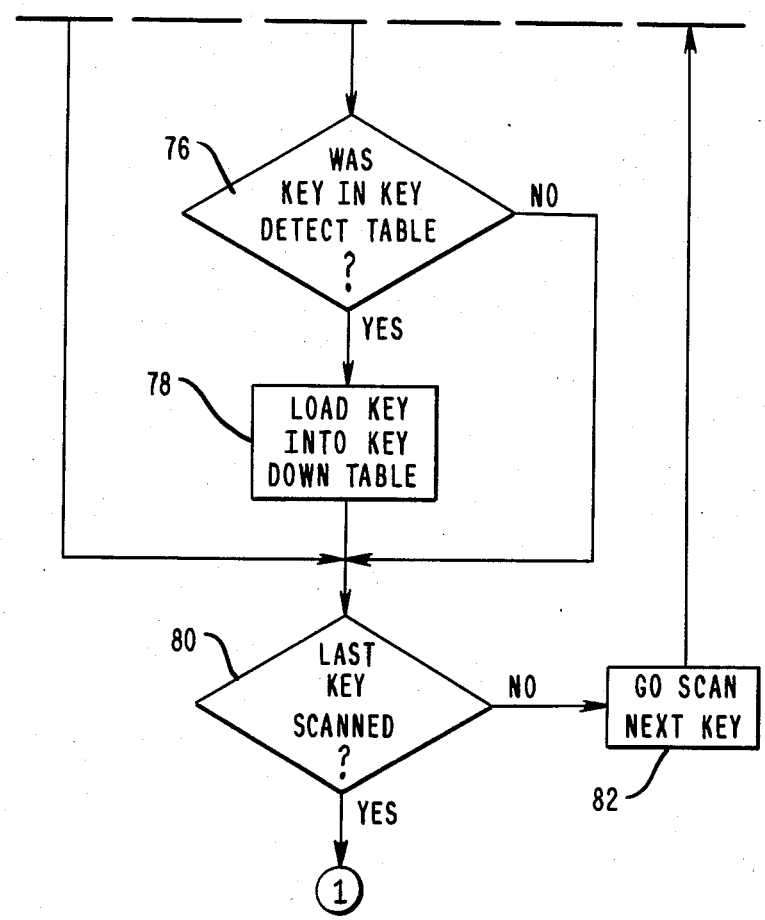

Referring now to FIGS. 6A and 6B, the chord entry keying process is started or commenced with the scanning of the first key upon the process step of stopping and clearing the function timer and beginning key scan (block 60) and then determining if the key is depressed (block 62). If the first key is not depressed, the next steps proceed to scan the next key (block 64) and then return for the question of key depression. If the key is depressed, the key is loaded into the key detected table (block 66) and then the inquiry is made as to the last key scanned (block 68). If in the negative, a return is made to scan the next key (block 64). When the last key scanned responds in the positive, the query is whether the time frame is 10 milliseconds up from begin of scan (block 70). If not, the return is made to again query the time frame. When the 10 millisecond query is in the positive, the process moves to begin the second key scan (block 72).

Continuing with the next step is the question of whether the key is down (block 74). If the answer is yes, the next inquiry is whether the key was in the key detect table (block 76) and if affirmative to such inquiry, the next step is to load the key into the key down table (block 78). The next step is made to inquire as to the status of the last key scanned (block 80).

If the answer to the query of whether the key is down (block 74) is negative, the process moves to the last key scanned step (block 80). If the check of the last key scanned is negative, the process moves to the step to scan the next key (block 82) and then to return to the inquiry of whether the key is down (block 74).

Figure 7A:
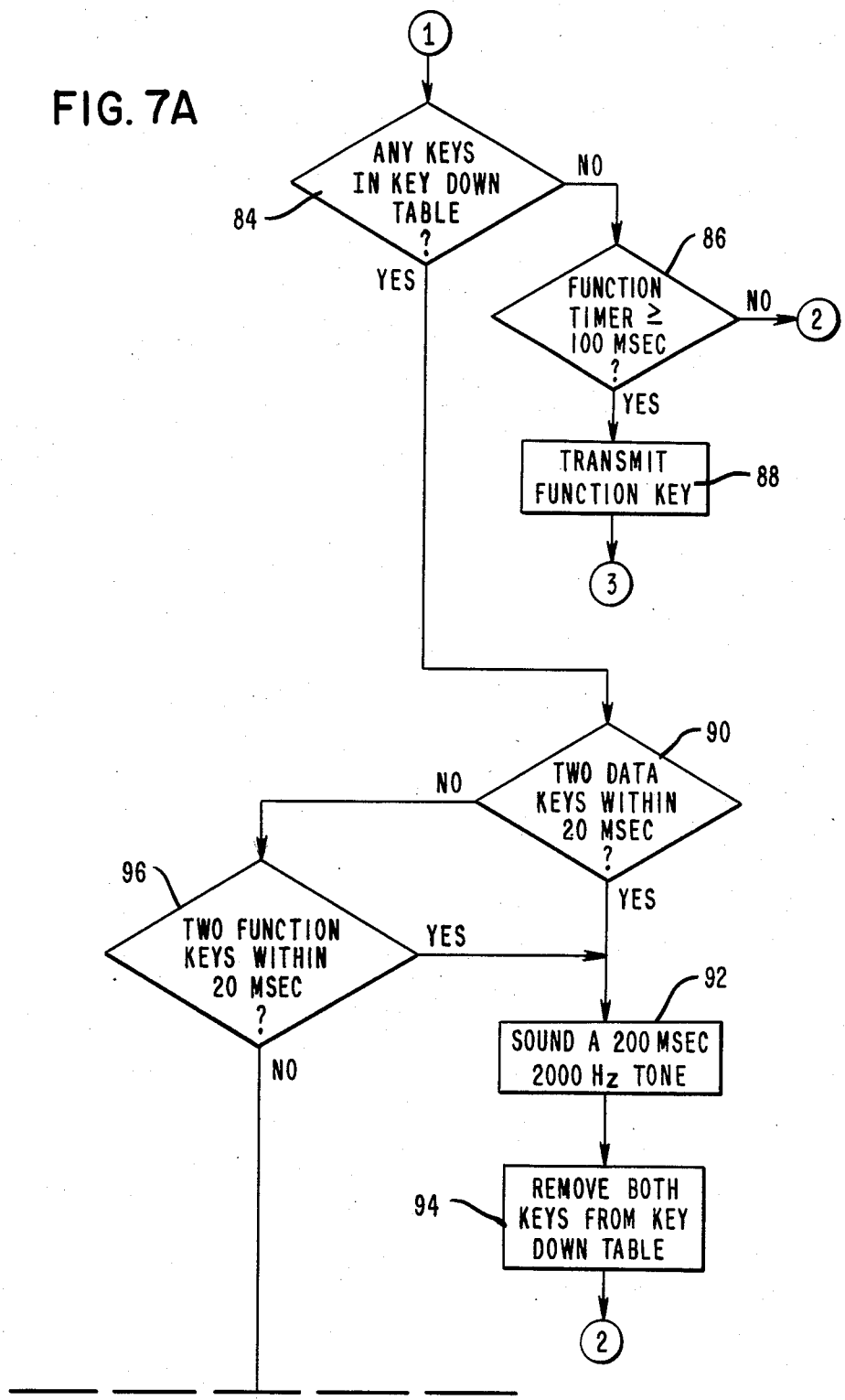
Figure 7B:
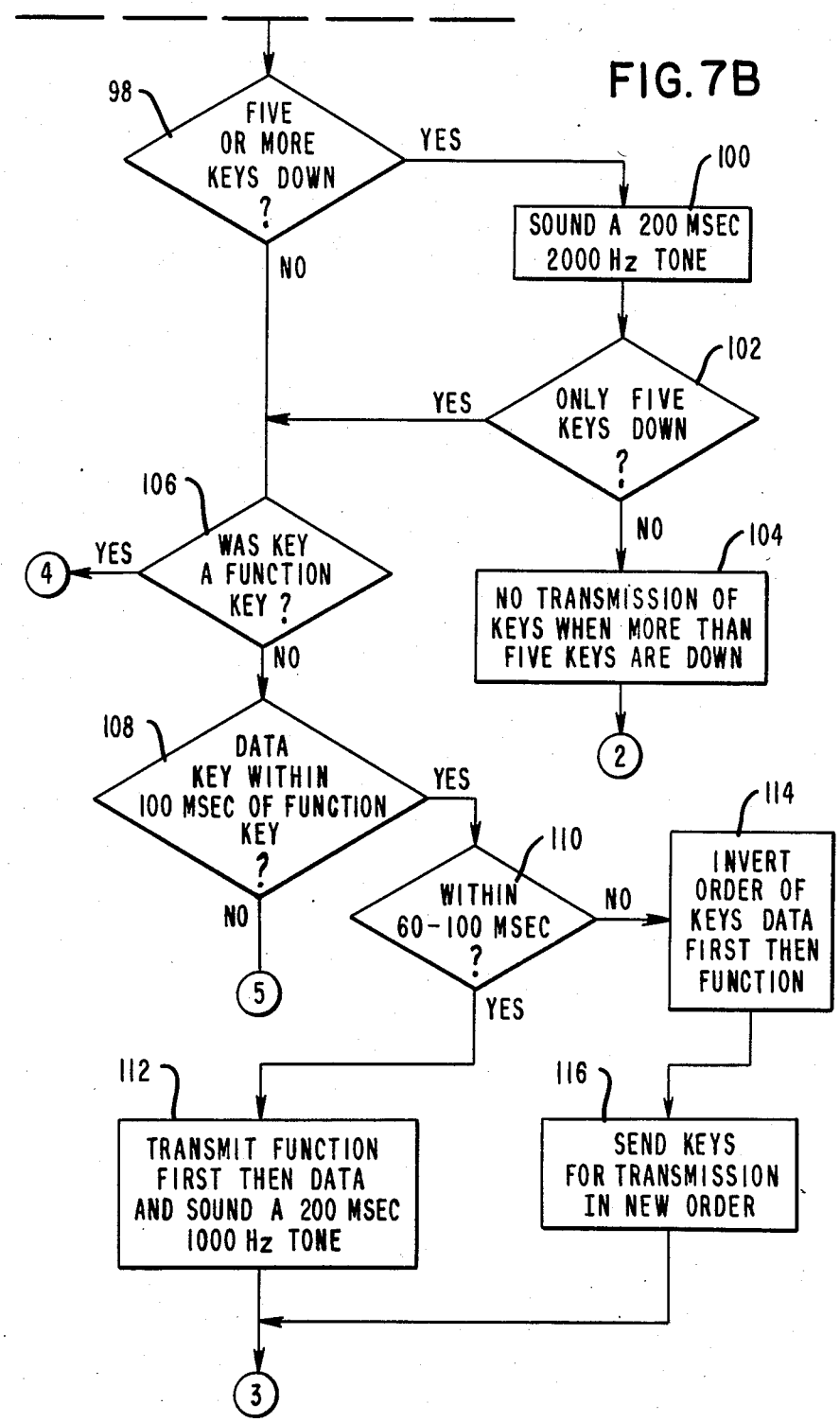

If the check of the last key scanned (block 80) is affirmative, the process continues to the flowchart in FIGS. 7A and 7B and a check is made of any keys in the key down table (block 84). If negative, the time of the function timer (block 86) is checked and if the timer shows more than 100 milliseconds, the next step is to transmit the function key (block 88) and then to return to the start of the process. If the function timer shows less than 100 milliseconds, the return is to the key depressed step of FIG. 6A (block 62).

When the check of whether any keys in the key down table (block 84) is affirmative, the next step inquires as to whether they are two data keys within 20 milliseconds (block 90). If the answer is positive, the next step reflects sounding a 200 millisecond 2,000 Hz. warning tone (block 92) and then to remove both keys from the key down table (block 94) after which the move is made to return to the key depressed step of FIG. 6A (block 62).

When the check of the two data keys within 20 milliseconds (block 90) is negative, the next query is made whether there are two function keys down within 20 milliseconds (block 96). If affirmative, the move is made to sound the 200 millisecond warning tone (block 92), whereas if negative, the process sequence continues to FIG. 7B and the next query is whether five or more keys are down (block 98). If the answer is positive, the next step is to sound the 200 millisecond 2,000 Hz. warning tone (block 100) and then inquire if only five keys are down (block 102). If negative, the process provides for no transmission of keys when more than five keys are down (block 104) and return is then made to the key depressed step of FIG. 6A (block 62).

When the indication is that only five keys are down, the process moves to a check as to whether the key was a function key (block 106), which is also the query if the response is negative from five or more keys down (block 98). If there is negative response from the function key, an inquiry is made whether the data key is within 100 milliseconds of the function key (block 108) and then whether the time frame is within 60–100 milliseconds (block 110). If affirmative, the next process step is to transmit function first and then data and sound the 200 millisecond 1,000 Hz. warning tone (block 112) and then return to the start of the cycle. If the data key is not within 60–100 milliseconds, the next step is to invert the order of the keys, data first and then function (block 114). The next step therefrom is to send the keys for transmission in the new order (block 116) in return manner to the start of the cycle.

Figure 8:
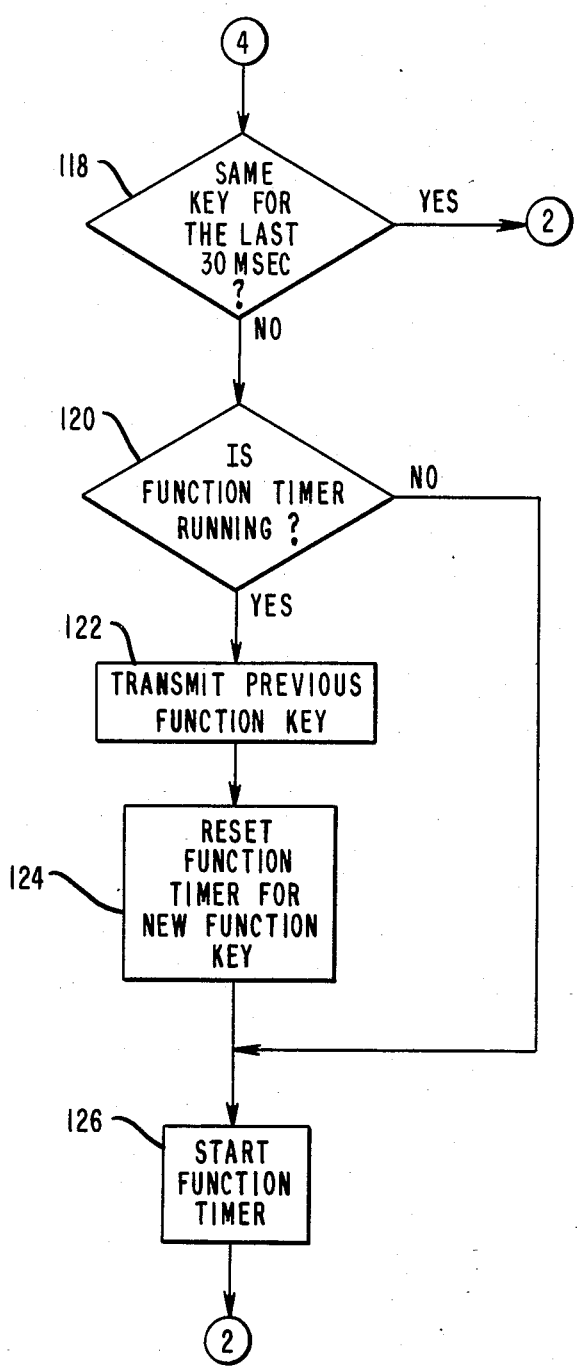

In the step inquiring whether the key was a function key (block 106), the process continues to FIG. 8 and an inquiry is made whether the same key is depressed for the last 30 milliseconds (block 118) and if positive, the return is made to the key depressed step of FIG. 6A (block 62). When the key is not the same for the last 30 milliseconds, the query is whether the function timer is running (block 120). If the timer is running, the next step is to transmit the previous function key (block 122) and then to reset the function timer for the new function key (block 124) and further to start the function timer (block 126) and to return to the key depressed step (block 62). If the function timer is not running (block 120), the sequence is to start the function timer (block 126).

Figure 9:
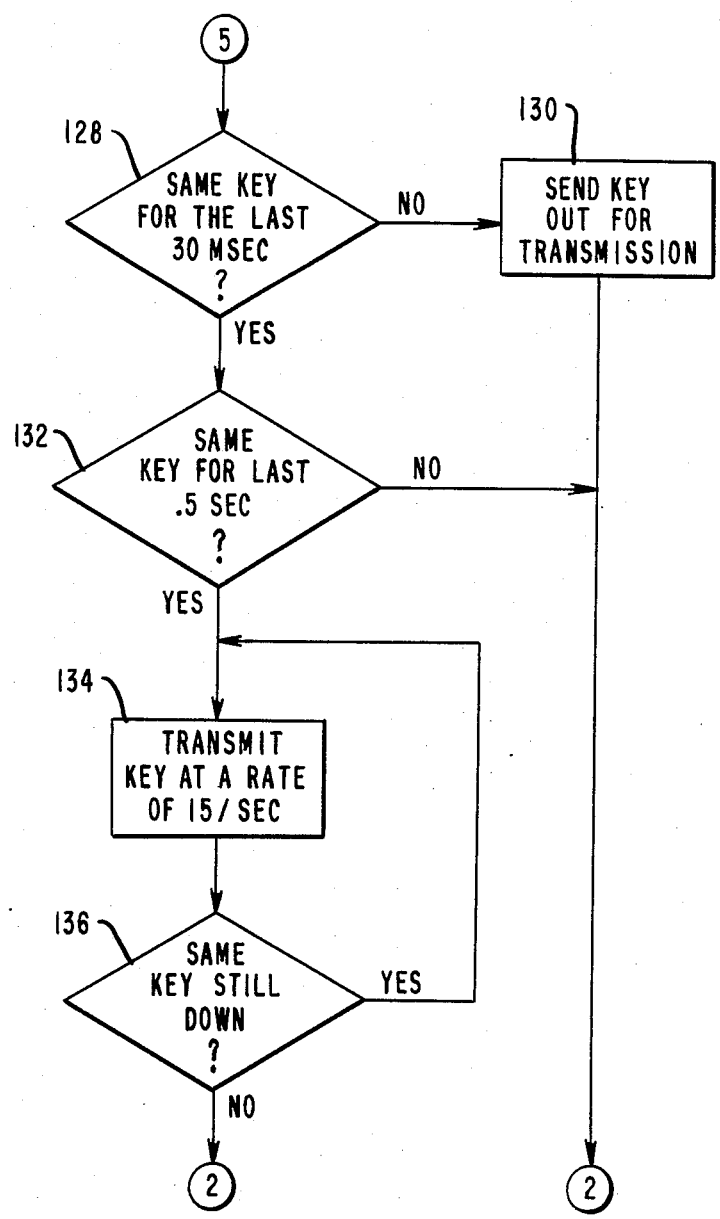

Returning back to FIG. 7B, if the check shows the data key was not within 100 milliseconds of the function key (block 108), the process continues to FIG. 9 for a check as regarding the same key for the last 30 milliseconds (block 128). If not the same key, the sequence is to send the key out for transmission (block 130) and then to return to the key depressed step of FIG. 6A (block 62). The next inquiry is whether the same key is for the last one-half second (block 132) and if in the negative, the return is made to the key depressed step (block 62). If affirmative, the next step is to transmit the key at a rate of 15 per second (block 134) and then check if the same key is still down (block 136). If affirmative, a return is made to transmit the key at the 15 per second rate whereas if negative, the return is made to the key depressed step (block 62).

Figure 10:
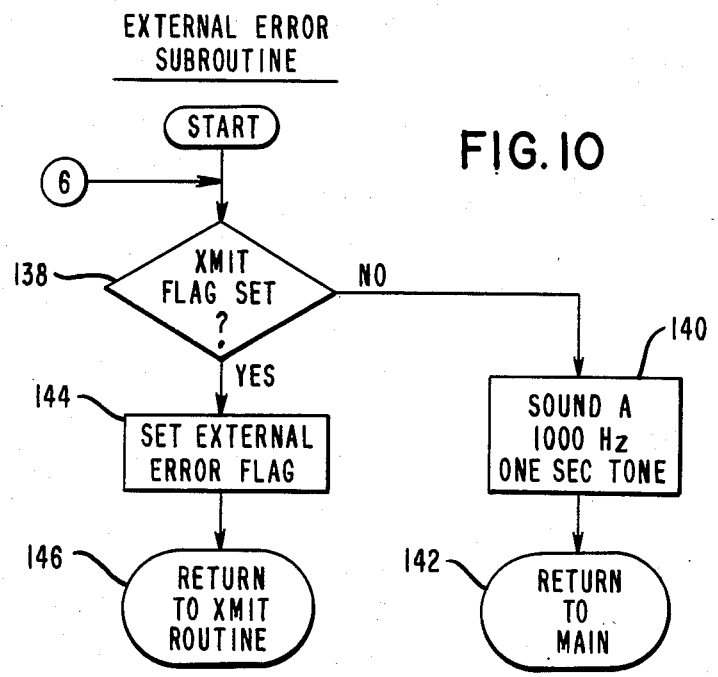

FIG. 10 illustrates the flowchart for the external error subroutine wherein the process checks whether the transmitter flag is set (block 138). If negative, the step is to sound a 1,000 Hz. one second warning tone (block 140) and then return to the main routine (block 142). If the transmitter flag is set, the next step is to set the external error flag (block 144) and then to return to the transmitter routine (block 146).

Figure 11:
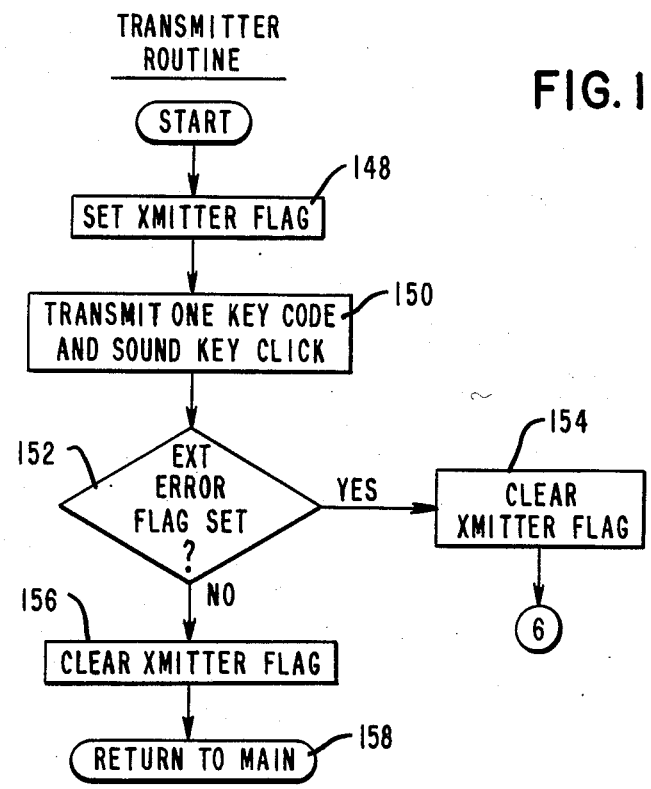

The chart for the transmitter routine is illustrated in FIG. 11 wherein the first step is to set the transmitter flag (block 148) and then to transmit one key code and sound the key click (block 150). The next check is made to determine if the external error flag is set (block 152) and if affirmative, the process is to clear the transmitter flag (block 154) and a return is then made to inquire if the transmitter flag is set (block 138), FIG. 10. If the external error flag is not set, the process continues to clear the transmitter flag (block 156) and to return to the main routine (block 158).

Figure 12:
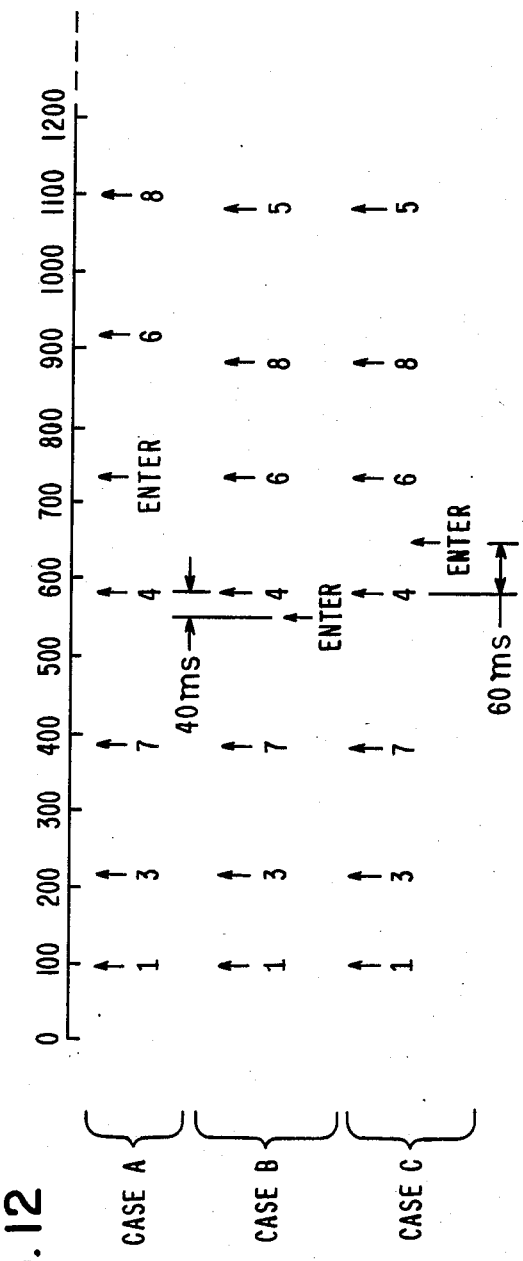
FIG. 12 is a timing chart showing serial entry vs. chord entry of numeric fields in data entry.

FIG. 12 is a timing chart illustrating serial vs. chord entry of numeric data fields. As mentioned above, conventional 10-key numeric data entry consists of serially depressing several numeric data keys followed by a data entry or function key. The numeric keys belong to a numeric data field and this field is entered via a subsequent entry key depression, as presented in Case A of FIG. 12. Since the entry key always follows the last numeric key of the current numeric field, its serial location at the end of the keying sequence provides inherently redundant information to the keyboard processor. Thus, when the entry key and the last numeric key are depressed simultaneously, rather than serially, the same information is provided. This procedure eliminates the time required to serially enter each numeric data field.

While it is known, as mentioned above, that an operator cannot depress two keys at exactly the same instant, Case B and Case C of FIG. 12 schematically present the two most likely results of attempted simultaneous key depressions. In Case B, the entry key precedes the last numeric key by 40 milliseconds, whereas in Case C, the entry key follows the last numeric key by 60 milliseconds. To successfully implement the chord entry concept, the keyboard logic must be able to recognize both Case B and Case C as the data 1374.

Ideal chord entry keying performance can be characterized by three distinct keying time distribution parameters. First, chord entry times should cluster around zero, that is last digit and entry keys should be depressed simultaneously. Second, chord entry inter-item times should cluster around an operator's mean inter-item time for conventional serial entry numeric keypads, that is, the chord entry procedure should not affect the operator's rhythm for subsequent key depressions. Third, chord entry times and chord entry inter-item times should not overlap as this may lead to chord entry keying errors, that is, the keyboard logic may be unable to distinguish between the last digit of the current amount and the first digit of the next amount. To the extent that an operator's performance differs from these ideal time distibution characteristics, the operator will key less efficiently and/or less accurately than is theoretically possible.

It has been found that the greatest difficulty in implementing the chord entry concept is the necessity to successfully differentiate between the last and first digits of successive amounts when the entry key is depressed excessively early or excessively late. When depressed too early, the last digit of the current amount may be erroneously decoded as the first digit of the next amount. When depressed too late, the first digit of the next amount may be erroneously decoded as the last digit of the current amount. It is noted that in either case, two keying errors may result unless the current amount ends in zero or multiple zeros. As an example, if the current amount and the next amount are 1234 and 5678, respectively, an excessively early chord entry may result in 123 and 45678 being entered, whereas an excessively late chord entry may result in 12345 and 678 being entered.

Figure 13:
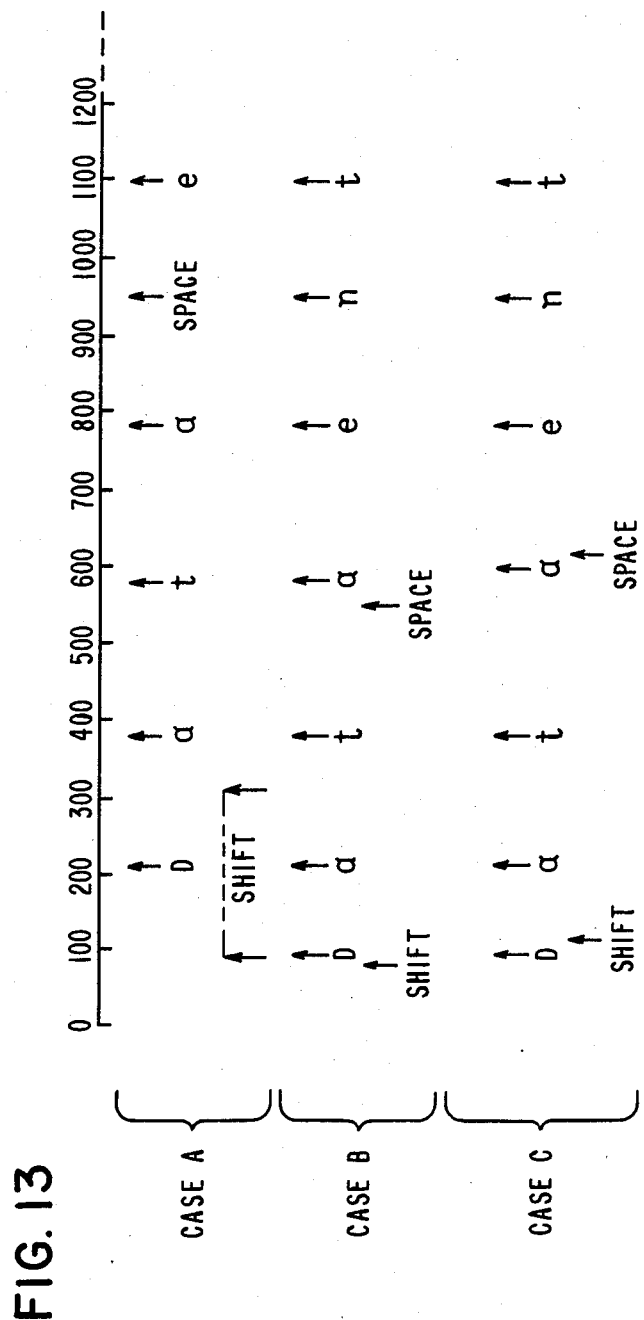
FIG. 13 is a timing chart showing serial entry vs. chord entry of alpha fields in data entry.

FIG. 13 is a timing chart related to the alpha keying chord entry concept similar to the chart of FIG. 12. It is seen that the inclusion or substitution of alpha keys for numeric keys is within the concept of simultaneous entry and that the concept is expanded to simultaneous keyboard entry of the last character of a word and the space between words as well as to the simultaneous or momentary entry of the shift key and an upper case character.

Conventional alpha keyboard entry is a serial process and if elements in this process can be keyed simultaneously, the time required to enter a string of alpha characters can be shortened. Such simultaneous entry is feasible whenever the serial entry of alpha string elements provides only redundant information and an examination of the conventional alpha keying sequence suggests two candidates for simultaneous entry.

First, whenever a shift to upper case is required for the entry of one character as in capitalization as presented in Case A of FIG. 13, there is no informational requirement for serially pressing and then holding the shift key as is the normal operating sequence on conventional keyboards. The proper decoding logic provides that the same information can be transmitted by a brief operation of the shift key at a time close to the time when the alpha key is pressed, as seen in both Case B and Case C of FIG. 13. In addition to eliminating the time required for one sequential step, the new operating sequence allows operators to return their little fingers from the shift keys to the home key positions more quickly. This in turn will reduce the time required to press the home key character if it should follow next in the keying sequence. A second opportunity for simultaneous entry occurs whenever a space is inserted between words, as illustrated in Case A of FIG. 13. The information to be transferred here concerns the end or last letter of a word and the insertion of a blank space thereafter. This information does not have to be sequentially spaced to be correctly interpreted, since it is not being recorded on a one-to-one basis. As long as the space bar is operated in unambiguous association with the final character of the word, the same information is present as shown in Case B and Case C of FIG. 13.

The rules for decoding simultaneous entries of shift and alpha keys are first, that if the shift key is held down during an alpha key entry, the alpha key is decoded as an upper case entry which corresponds to and allows conventional serial entry as seen in Case A of FIG. 13. Secondly, if the onset of the alpha key follows the onset of the shift key within 60 milliseconds, but there is no overlap between the two keys down times, the alpha key is still decoded as an upper case character as seen in Case B. Operators need only momentarily press the shift key. Third, if the onset of the shift key is within 60 milliseconds after an alpha key onset, the alpha key is also decoded as an upper case character as seen in Case C. Rules 2 and 3 should account for the majority of normal operator deviations from near-simultaneous or simultaneous entry. A fourth rule is provided both to prevent errors and to continuously monitor and train operators in simultaneous key entry. In accordance with such rule, if an alpha key onset occurs sometime between 60 and 100 milliseconds after a shift key onset and the shift key downtime does not overlap with the alpha key onset, the entries are decoded the same as in Rule 2, but a warning tone is sounded. This tone tells operators that the last simultaneous entry was ambiguously timed and should be checked. The tone also provides the operators with feedback on their simultaneous entry performance and aids in learning and maintaining this skill.

The rules for decoding simultaneous entry of the space and the last alpha character of a word are first that if the space bar onset occurs after the last alpha character of a word and more than 100 milliseconds before the next alpha character entry, it is decoded as a space after the last alpha character of a word as seen in Case A and Case C (FIG. 13). This corresponds to and allows conventional serial entry. Secondly, if the onset of the alpha key follows the onset of the space bar within 60 milliseconds, the alpha key is decoded as the last character of the word and the space inserted after it. That is, the alpha key and space bar entries are temporarily reversed during decoding as seen in Case B. Third, if the onset of an alpha key occurs sometime between 60 and 100 milliseconds after the onset of a bpace, the input is again decoded as in Rule 2 but a warning tone is sounded. The warning tone tells the operator to verify the last entry and also aids the operator in maintaining the skill required for near-simultaneous key inputs.

It should be noted here that operator thruput is defined as the total number of items which could be processed in one hour of continuous keying operation based on time measurements for 1,000 successive test items. It is also noted that breaking down overall thruput performance into elemental time components simplifies the analysis of thruput improvements. The elemental time components investigated were total time, inter-item time, amount time, preview time, clear time and recall time.

Figure 14:
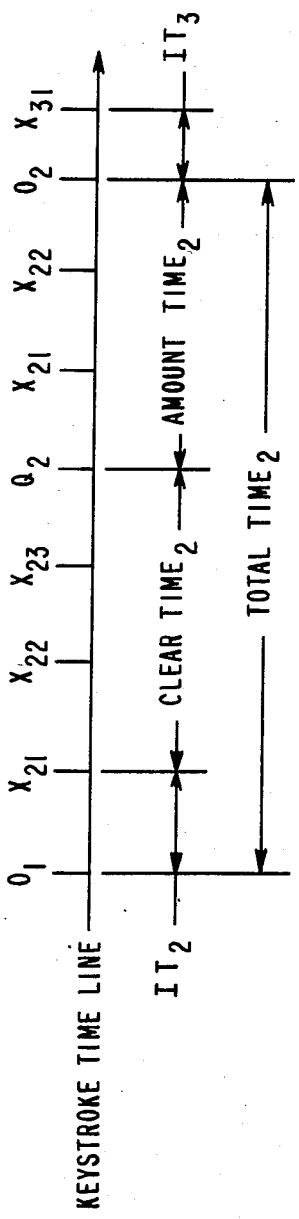
FIG. 14 on the sheet containing
Figure 15:
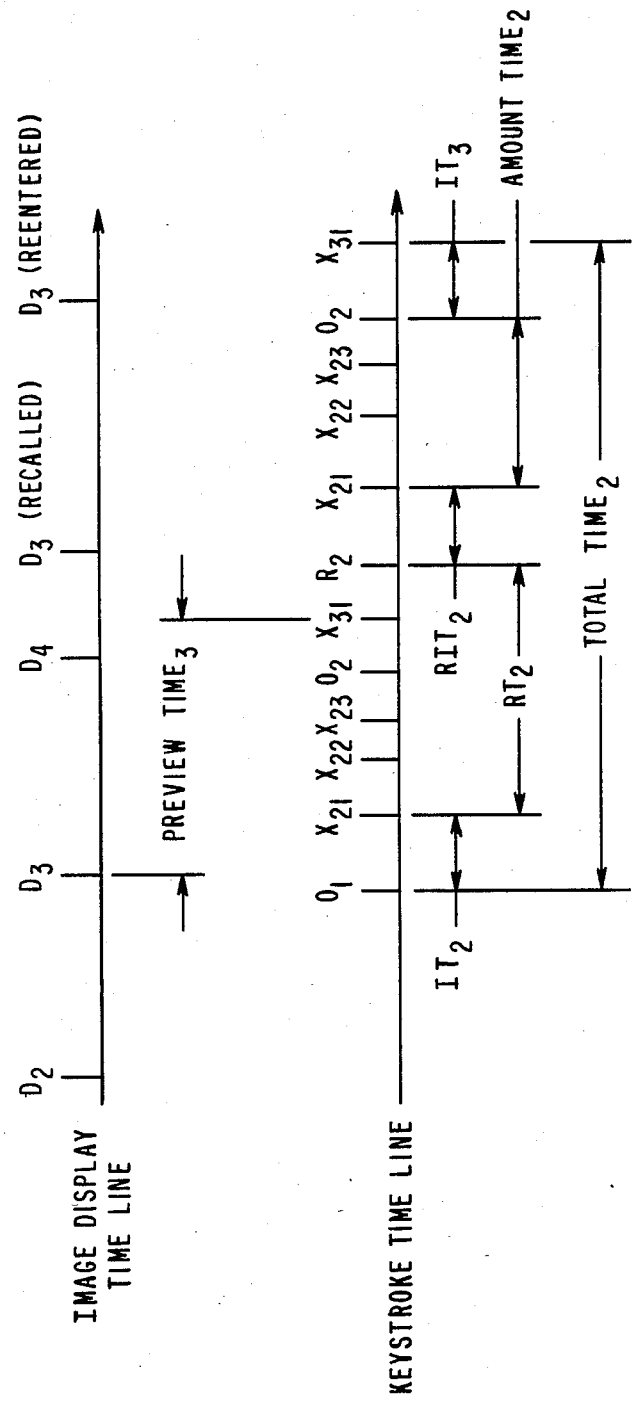
FIG. 15 is a diagram showing time components for a typical recalled entry item.

The total time is the time between the last keystroke of the preceding item and the last keystroke of the current item for a typical entry item as illustrated in FIG. 14. The total time includes the inter-item time which is the time between the last keystroke of the preceding item and the first keystroke of the current item. The amount time is the time between the first and last keystrokes of the current item amount entry. The preview time is illustrated in FIG. 15, which shows a typical recalled entry item, and is the time between the first display of a preview item and the first keystroke of this item. The clear time is the non-productive time spent keying and clearing a detected keying error in the current item, and the recall time is the non-productive time spent recalling, rekeying and reentering a detected keying error in the preceding item.

Figure 16:
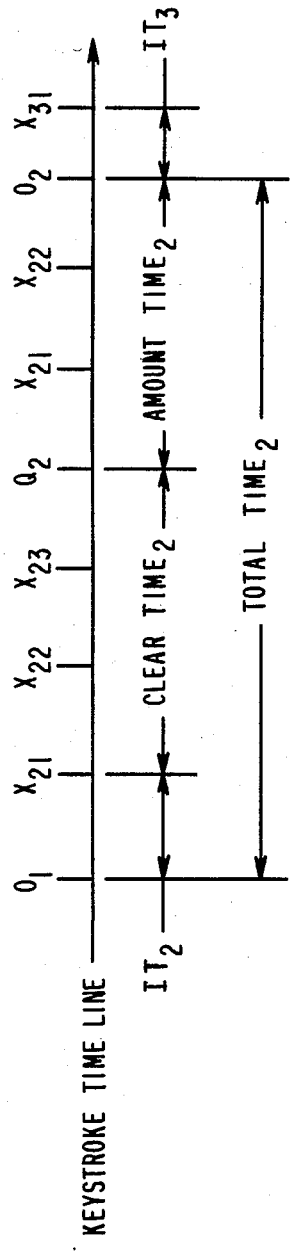
FIG. 16 is a diagram showing time components for a typical chord entry item with chord entry of the entry key following the last digit of the data field.
Figure 17:
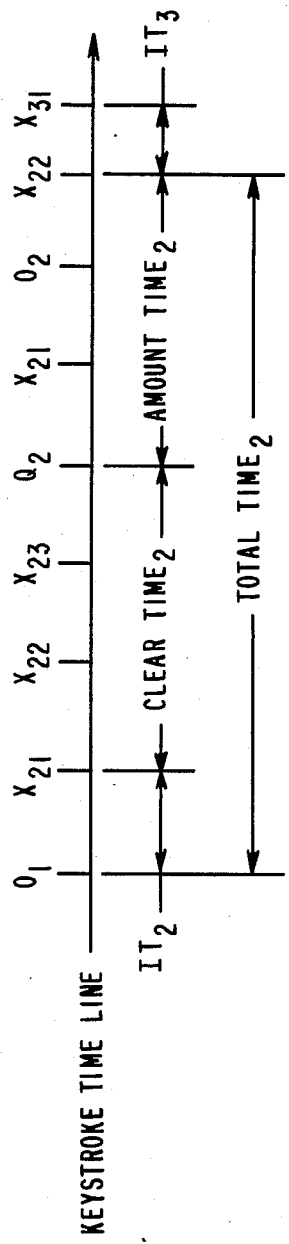
FIG. 17 is a diagram showing time components for a typical chord entry item with chord entry of the entry key preceding the last digit of the data field.

The elemental time components for a typical chord entry item are schematically illustrated in FIG. 16, which shows chord entry with entry key following the last digit of the current amount, and in FIG. 17, which shows the chord entry with the entry key preceding the last digit of the current amount. In FIGS. 14, 15, 16 and 17, the legend for the various notations are as follows:

$O_1$: Put-away of Item 1
$X_{21}$: First keystroke of Item 2
$X_{22}$: Second keystroke of Item 2
$X_{23}$: Third keystroke of Item 2
$Q_2$: Clear keystroke for Item 2
$O_2$: Put-away of Item 2
$R_2$: Recall of Item 2
$RT_2$: Recall time of Item 2
$IT_2$: Inter-item time of Item 2
$IT_3$: Inter-item time of Item 3
$RIT_2$: Recall Inter-item time of Item 2
$D_2$: Display of Item 2
$D_3$: Display of Item 3
$D_4$: Display of Item 4

It is thus seen that herein shown and described is a procedure and arrangement for chord entry keying of alpha and numeric data for increasing thruput efficiency and for reducing the amount of error. The arrangement of the present invention enables the accomplishment and advantages mentioned above, and while a preferred embodiment has been disclosed herein, variations thereof may occur to those skilled in the art. It is contemplated that all such variations not departing from the spirit and scope of the invention hereof are to be construed in accordance with the following claims.

We claim:

1. A keyboard system having a plurality of data keys and function keys arranged in a manner to be operated by one or both hands, and logic means permitting chord entry keying of characters into the keyboard upon substantially simultaneous depression of more than one key of the keyboard wherein data is entered upon depression of one or more data keys and upon depression of a function key within a predetermined time frame prior to or after the depression of the last data key.

2. The system of claim 1 wherein the data keys contain numeric data.

3. The system of claim 1 wherein the data keys contain alphabetic data.

4. The system of claim 1 wherein the logic means includes scanning the several keys of the keyboard for determining depression thereof.

5. A keyboard arrangement for use in chord entry keying of data fields and having a plurality of data keys and function keys, the arrangement including logic means for controlling the keying of characters into the keyboard upon substantially simultaneous depression of more than one key of the keyboard whereupon data is transmitted and entered upon depression of one or more data keys and upon depression of a function key within a predetermined time frame prior to or after the depression of the last key transmitting data for reducing the time of transmitting and entering said data.

6. The arrangement of claim 5 wherein the data keys contain numeric data.

7. The arrangement of claim 5 wherein the data keys contain alphabetic data.

8. The arrangement of claim 5 wherein the predetermined time frame is less than 100 milliseconds.

9. The arrangement of claim 6 wherein the predetermined time frame is within 60 milliseconds of the depression of the last data key.

10. A method of reducing the time of transmitting and entering data in a keyboard having data keys and function keys comprising the steps of:
   depressing one or more keys for transmitting data from a field of data,
   depressing a function key for entering the data at substantially the same time as depressing the last key of the data keys, and
   determining that the field of data is transmitted and entered into the keyboard whenever the last key of the data field is depressed within a predetermined period of time prior to or after the depression of the function key.

11. The method of claim 10 including the additional step of scanning the several keys of the keyboard for determining depression thereof.

12. A process for chord entry keying of a field of data in a keyboard having a plurality of data keys and function keys comprising the steps of:

depressing one or more data keys for transmitting data from the field of data, scanning the data keys for determining last key depression thereof, depressing a function key substantially simultaneously with depression of the last data key, and determining that the field of data is entered in the keyboard whenever the last key of the data field is depressed within a predetermined period of time prior to or after the depression of the function key for reducing the time of entering the field of data.

* * * * *